United States Patent Office 3,463,698
Patented Aug. 26, 1969

3,463,698
LAMINATED PLATE FOR ELECTRICAL APPARATUS AND METHOD FOR MAKING SAME

Kotaro Yanagihara, Tokyo, and Takenori Suzuki, Kawasaki-shi, Japan, assignors to Fuji Tsushinki Seizo Kabushiki Kaisha, Kawasaki, Japan, a corporation of Japan No Drawing. Continuation-in-part of application Ser. No. 71,462, Nov. 25, 1960. This application June 14, 1965, Ser. No. 463,912
Int. Cl. B32b 27/36
U.S. Cl. 161—186 8 Claims This application is a continuation-in-part of our application Ser. No. 71,462, filed Nov. 25, 1960, now abandoned.

Our invention relates to reinforced plastics, particularly to reinforced plastics having good electrical and physical characteristics for use as printed circuit boards, and the invention is also directed to methods for making such reinforced plastics and printed circuit boards.

Printed circuit boards as used in the electronic industry usually consist of synthetic resin laminated plates as a base which are coated on one or both sides with copper foil. The copper acts as the conductor and can be replaced by other conductors and can be omitted in portions of the circuit where conductivity is not desired.

Most of the base materials heretofore in use consisted of paper and phenolic resin laminates. Such materials were adequate when the circuit boards made therefrom were used for ordinary household goods such as radios and hearing aids. But, when as at present, it is desired to use such printed circuit techniques in precision electronic apparatus for scientific, industrial and commercial communication use such as high-frequency circuits for TV frequencies and higher (UHF–VHF etc.); electronic computers; automatic control apparatus components; carrier communication apparatus (FM, police, etc.); electronic telephone switching devices; and specialized components in scientific measuring devices such as gas chromatographs, many problems arise calling for particularly stable materials that will assure the reliability of these devices and components during operation under the rigors imposed by the mode and environment of use.

Most previously used materials exhibit the following shortcomings:

(1) Their electrical properties change beyond tolerable limits with changes in ambient temperature and humidity.

(2) Their dimensional stability varies with humidity, temperature and time, showing considerable warping or shrinkage.

(3) They generally show poor machineability unless heavily plasticized, which latter causes loss of important electrical characteristics such as dielectric qualities.

(4) Their chemical resistance to many commonly used processing chemicals is limited, requiring that dip-soldering, plating, etching and similar operations be limited with respect to useful materials or mode of treatment.

Further, under many conditions of industrial use, the chemical, dimensional and electrical qualities of the previously used materials are destroyed or seriously compromised by ambient conditions such as extremes of heat, cold, humidity, bacterial and molds, oils, dusts and variations or combinations of such ambient conditions.

One laminated base material that has been found to overcome some of these faults, and which has had some industrial use in precision apparatus, is a glass fiber-epoxy resin laminated. However, such a material is three to four times as expensive as high-grade paper-phenol materials (XXXP of NEMA standard). This glass-containing material is also very difficult to fabricate since punching and drilling operations cause wear and damage to the tools used in such operations. The wear and damage are due to the glass substrate.

Laminated plates useful for electric circuits and suitable for mass production of industrial and electronic apparatus should have the combined characteristics of the paper-phenol laminates and the glass(fiber or cloth)-epoxy laminates. They should have the low cost of the former and the excellent physical, chemical and electrical properties of the latter. Additionally they should be at least as readily machinable as the paper-phenol laminates and should be easily manufactured without cumbersome processing steps or equipment.

It is the object of this invention to provide such laminated plates for electrical circuits and processes for preparing same.

The above object and others, which will be apparent from the description of the laminated plates and the process for making them, are achieved by the use of a rigid, laminated plate suitable for electrical apparatus which comprises a plurality of layers of a polyethylene terephthalate polyester fabric as a substrate. The substrate in the form of fibers or fabrics is coated from solution with a polyisocyanate compound having at least two isocyanate groups in its molecule, and it is then impregnated or coated with a thermosetting resin capable of forming chemical bonds with the isocyanate groups in the nature of dipole groups inducible from the isocyanate group. A plurality of these treated layers are then placed one upon the other and subjected to pressure and heat to set in the form of a rigid laminate. To at least one surface of such a laminate may be bonded conductive (copper) foil to form an electroconductive layer thereon.

The polyethylene terephthalate fibers, which are utilized for the base material of the reinforced plastic of this invention, consist of fibers made by extruding and orienting high molecular weight esters of ethylene glycol and terephthalic acid. Their electrical properties and moisture resistance are similar to glass fibers. However, they are superior to glass in machineability and cost. Representatives of the general class of polyethylene terephthalate fibers are marketed as Terylene (I.C.I. Co.), Dacron (Du Pont), and Tetron (Toyo Rayon & Teikoku Rayon Company).

The isocyanate compounds useful in this invention are aromatic or aliphatic polyisocyanates, primarily diisocyanates and triisocyanates, and their initial polymerization products having at least two or more isocyanate groups per molecule and may also contain urethane groups within their molecule. Such isocyanates are dissolved in suitable organic solvents such as aromatic hydrocarbons, chlorinated hydrocarbons, esters or ketones.

The thermosetting resins useful for this invention and capable of forming primary or secondary bonds with the isocyanate group or a plurality of dipole groups inducible from the isocyanate group consist of phenol-formaldehyde resins, and unsaturated polyester resins taken from the class consisting of glycol-maleic acid condensation products, alkane diol-fumaric acid condensation products, and alkane diol-chlorinated phthalic and terephthalic acid condensation products.

Generally, the process of making the laminated plates for electrical circuits, which are the basis of this invention, consists of the steps of coating each of a series of separate layers of polyethylene terephthalate fiber either in the form of cloth, mat, woven or non-woven fabrics, chopped strand, rovings, and the like, with an organic solvent solution of the above-mentioned polyisocyanate compounds having at least two isocyanate groups in the molecule. The coated, separate layers are then heated at about 80 to 180° C. and the so-treated layers are coated with the thermosetting resin set forth above as capable of forming chemical bonds with the isocyanate groups. A pre-preg of a plurality of such coated layers, placed upon one another, is then subjected to pressure and heat to form a rigid laminate.

Among the polyisocyanate compounds suitable for the purpose of this invention are metaphenylene diisocyanate; 2,4-toluene diisocyanate; 2,6-toluene diisocyanate; diphenyl-methane - 4,4′-diisocyanate; diphenyl-4,4′-diisocyante; 1,5- diisocyanate naphthalene; 2,4-diisocyanate chlorbenzene; 4,4′,4″-triisocyanate triphenyl methane; polymethylene diisocyanate and the reaction products of polyisocyanate compounds with polyhydric alcohols such as glycols or triols. One such reaction product polyisocyanate is the polymerization product of three mols. of 2,4-toluene diisocyanate and 1 mol. of 2,3,5-hexane triol. All of the above compounds have at least two isocyanate groups within their molecule. The last group, i.e. the reaction product compounds, in addition contains at least two urethane groups within the molecule. It should be noted that the first seven compounds mentioned are aromatic and that the polymethylene diisocyanate represents the class of alphatic polyisocyanate compounds. The above-described compounds are favorable to the process of this invention because of their chain flexiblity and low vapor pressure. The reaction product of the polyisocyanate with the polyhydric alcohols are particularly easy to handle and are colorless and non-toxic and for these reasons are useful on an industrial basis.

The following organic solvents can be used for the various polyisocyanate compounds mentioned above: methylene chloride, dichlorethane, trichloroethylene, methyl acetate, ethyl acetate, acetone, methyl ethyl ketone, benzene, toluene. These solvents can be used independently or in admixture. They must be free of moisture and other impurities.

The processes for preparation and characteristics of the reinforced plastic laminates of this invention will be specifically described in the examples below. All obvious alternates and equivalents of the ingredients and steps are intended to be included within the scope of this invention.

Example 1

A solution in 670 g. of trichlorethylene is prepared from 100 g. of the reaction product of 3 mol. 2,4-tolyldiisocyanate and 1 mol. 2,3,5-hexane triol (sold as Desmodur L by the Bayer Co.). Into this solution is dipped, at room temperature, polyethylene terephthalate fiber cloth having a yarn fineness of 250 denier, and a spinning number of 40 lines per inch, both longitudinally and laterally. After light pressing between rolls to remove the excess solution, the cloth is heated and dried for 15 minutes at a temperature of 135° C. A 4.5% by weight adhesion of the Desmodur L polyisocyanate to the base material is obtained.

The treated base material is then impregnated with commercial phenolic resin (Polyophen 5030 Japan Reichhold Chem. Inc.) or unsaturated polyester resin (Polylite ODR–105, allyl type, benzoyl peroxide used as a catalyst, Japan Reichhold Chem. Inc.), and dried. A pre-preg of about 50% resin is thus prepared. The term pre-preg signifies the impregnated fiber mats treated as described immediately above. Eight sheets of this pre-preg are stacked and held in a laminating press.

The forming is carried out under a pressure of 85 kg./cm.$^2$ at a temperature of 145° C. for 80 minutes in in the case of the phenol resin, and for 60 minutes under a pressure of 10 kg./cm.$^2$ at a temperature of 120° C. in the case of the unsaturated polyester. In both cases, post-curing is carried out for 120 minutes at a temperature of 140° C. A sample of this laminated plate is prepared, 1.4 to 1.5 mm. thick, and with a resin content of 40 to 45%. These materials are compared to similar laminates made from the same polyester fiber base and resins but without the Desmodur L treatment. This is the control material shown in Table 1 below as "fiber untreated."

Their characteristics were compared and the results are set forth in Table 1.

TABLE 1.—CHARACTERISTICS OF THE SAMPLE IN EXAMPLE 1

| Characteristics | Phenol resin: Fiber treated | Phenol resin: Fiber untreated | Unsaturated polyester: Fiber treated | Unsaturated polyester: Fiber untreated |
|---|---|---|---|---|
| Volume resistivity, Ω-cm.: 30° C. 90% RH after 96 hrs | $1.4\times10^{13}$ | $5.2\times10^{11}$ | $3\times10^{13}$ | $1.2\times10^{11}$ |
| Insulation resistance, MΩ: (JISK 6707) after 2 hrs. boil | $>10^6$ | 8 | $>10^6$ | 5 |
| Water absorption, percent: 30° C., 24 hrs | 0.4 | 2.3 | 0.6 | 2.7 |

From the above table it can be seen that in the case of both the phenol resin and the polyester resin superior electrical and moisture-resistance properties, as compared to the untreated polyester resins, are obtained when the polyester fibers are pre-treated according to this invention.

The phenolic resin (Plyophen 5030) used in Example 1 consists of 40% commonly used phenol-formaldehyde resin of the resol type commonly used for lamination procedures. This is soluble in ethanol and in 40% alcohol. The unsaturated polyester (Polylite ODR–105) is applied in the form of a solution in 30% methyl ethyl ketone. The 70% consists of the addition product of diallylphthalate prepolymer, and an unsaturated polyester condensate of maleic hydride and glycol.

Example 2

To both sides of an unsaturated polyester laminate plate made of the treated base described in Example 1, are affixed copper foils of thickness 0.035 mm. These foils are of a type used for printed circuits and are attached to the laminate by means of an epoxy resin adhesive using a polyamide resin hardener. The adhesive is set by the use of heat and pressure, i.e. 90 minutes at a temperature of 150° C. under a pressure of 40 kg./cm.$^2$. This copper clad polyester laminate plate is designated TAP in the summary below.

A 1.6 mm. thick copper laminate plate (designated TGP in the summary below) is formed under the same conditions as in the case of TAP. The same kind of electrolytic copper foil is applied to both sides, employing two folded sheets of glass cloth (pre-preg thickness: 0.15 mm.). An epoxy resin (the hardener is diamino diphenyl sulfone) is impregnated into and is dried on the top and bottom of six sheets of a pre-preg made by the impregnation with unsaturated polyester of a treated base material, and drying, as in Example 1.

The two samples prepared as above (TAP and TGP) were compared with printed circuit base plates prepared from a kraft paper/phenolic resin coated with copper on both sides and in the form of a printed circuit plate (NEMA standard; XXX P class) and the results are presented in Table 2.

TABLE 2.—CHARACTERISTICS OF THE PRINT CIRCUIT BASE PLATE IN EXAMPLE 2

| Characteristics | Applicable spec. | Conditioning | Unit | TGP | XXXP | TAP |
|---|---|---|---|---|---|---|
| Tensile strength | JISK 6707 | Normal | Kg./cm.$^2$ | 810 | 700 | 640 |
| Young's modulus at bending | According to JIS | do | $10^5\times$kg./cm.$^2$ | 1.2 | 1.2 | 0.4 |
| Coeff. of thermal expansion | Co. spec | 20–100° C | $10^{-5}\times$l./C | 3.9 | 3.5 | 9.0 |
| Insulation resistance | ASTM test pattern | Normal | MΩ | $>10^7$ | $>10^6$ | $>10^7$ |
| | | After 30° C. 24 hrs. dip. | MΩ | $10^{5\sim 6}$ | $10^{4\sim 5}$ | $10^{5\sim 6}$ |
| Volume resistivity | JISK 6707 | Normal | Ω-cm | $>10^{15}$ | $>10^{12}$ | $>10^{15}$ |
| | | After 30° C. 24 hrs. dip. | Ω-cm | $10^{14}$ | $10^{11}$ | $10^{14}$ |
| | | 100° C | Ω-cm | $5\times10^{13}$ | $6\times10^{11}$ | $8\times10^{13}$ |
| Dielectric strength | JISK 6707 | Normal (short time in oil). | Kv./mm | 40 | 34 | 40 |
| Dielectric constant | Mutual inductance bridge IM.C. | Normal | | 3.3 | 4.5 | 3.0 |
| | | 30° C. after 24-hr. dip. | | 3.5 | 5.0 | 3.2 |
| Dissipation factor | do | Normal | $\times10^{-4}$ | 250 | 350 | 210 |
| | | 30° C. after 24-hr. dip. | $\times10^{-4}$ | 280 | 400 | 240 |
| Dip-soldering resistance | Co. spec | 235±5° C | Sec | >10 | 10 | 5 |
| Punching quality | ASTMD 617–44 | Room temp. (normal). | Surface edge hole. | Fairly good | Very poor | Good |
| Water absorption | Co. spec | After 30° C., 24-hr. dip. | Percent | 0.7 | 2 | 0.6 |
| Expansion ratio by water absorption | Co. spec | Surface direction: 30° C. after 24-hr. dip. | Percent | <0.1 | 0.7 | <0.1 |
| | | Thickness direction: 30° C. after 24-hr. dip. | Percent | <0.2 | 1.2 | <0.2 |

The laminated plates made by the method of this invention are superior, in respect to electrical properties, moisture resistance and machineability, to the base materials commonly used in the past.

Where the laminated plate base material (TAP) is made from a polyester fiber (which is thermoplastic), the degree of mechanical strength and heat resistance of such plates is limited but adequate. However, where necessary, by changing the base material to the so-called sandwich type (TGP) having top and bottom covered by glass cloth to an extent such as not to weaken the machineability of the composite, this shortcoming of TAP can be fully remedied.

Example 3

A treatment solution is prepared by adding 500 g. of trichlorethylene to 100 g. of the product sold as Desmodur R, manufactured by the Bayer Co., which consists of 80% 4,4',4''-triphenylmethanetriisocyanate and 20% methylene chloride solvent. This treatment solution is substituted for the Desmodur L solution of Example 1 in the preparation of laminated plates. Table 3 shows the characteristics of a phenol-laminate plate and a polyester-laminate plate prepared in this manner as compared to the untreated controls.

TABLE 3.—CHARACTERISTICS OF PHENOL RESIN AND UNSATURATED POLYESTER IN EXAMPLE 3

[Adhesion amount of agent for treatment is about 6% of base material amount]

| | Phenol resin | | Unsaturated polyester | |
|---|---|---|---|---|
| Characteristics | Treated | Untreated | Treated | Untreated |
| Volume resistivity, Ω-cm.: 30° C., 90% RH after 96 hrs | $5\times10^{13}$ | $6\times10^{11}$ | $8\times10^{13}$ | $4\times10^{11}$ |
| Insulation resistance, MΩ: (JISK 6707) after 2 hrs. water boil | $>10^6$ | 10 | $>10^6$ | 8 |
| Water absorption, percent: 30° C., 24 hrs | 0.3 | 2.0 | 0.4 | 2.5 |

It will be apparent from the above examples and the tests cited therein that the products herein set forth are particularly useful where extreme degrees of stability and precision are required and where electrical characteristics of the highest order must be met. The products of this invention are particularly useful under circumstances where the components fashioned therefrom are continuously exposed to high humidity or water.

It should be understood, of course, that the foregoing disclosure relates to preferred embodiments of this invention and, as is shown by the composite laminate including subsurface layers of glass cloth, that it is also intended to cover various composites, changes and modifications of the examples of this invention which do not constitute departure from the spirit and scope of the invention as set forth in the appended claims.

We claim:

1. A rigid laminated plate for electrical apparatus comprising a plurality of layers of a polyethylene terephthalate polyester fabric coated from solution with a polyisocyanate compound having at least two functional isocyanate groups in its molecule, and impregnated with a thermosetting resin chosen from the group consisting of phenol-formaldehyde resins, glycol-maleic acid condensation products, alkane diol-fumaric acid condensation products, and alkane diolchlorinated phthalic and terephthalic acid condensation products, and thermoset to form the rigid laminated plate.

2. The laminated plate according to claim 1, wherein said laminated plate is bonded on at least one surface to a conductive copper foil.

3. The laminated plate according to claim 1, wherein in addition to the layers of polyethylene terephthalate polyester fiber there is included in the rigid laminate plate at least one glass fiber fabric layer.

4. A process of making a laminated plate for electric circuits, which comprises coating each of a series of separate layers of polyethylene terephthalate fiber with a solution in an organic solvent of a polyisocyanate compound having at least two functional isocyanate groups in its molecule; then heating said coated layers at about 80° to 180° C. and coating each so-treated layer with a thermosetting resin capable of forming chemical bonds with the functional isocyanate groups in the form of dipole groups inducible from the isocyanate groups, placing a plurality of said coated layers upon one another, and subjecting them to pressure and heat to form a rigid laminate.

5. A process of making a laminated plate for electric circuits, which comprises coating each of a series of separate layers of polyethylene terephthalate fiber with a solution in an organic solvent of a polyisocyanate compound having at least two functional isocyanate groups in its molecule; then heating said coated layers at about 80° to 180° C. and coating each so-treated layer with a thermosetting resin chosen from the group consisting of phenol-formaldehyde resins, glycol-maleic acid condensation products, alkane diol-fumaric acid condensation products and alkane diol-chlorinated phthalic and terephthalic acid condensation products, placing a plurality of said coated layers upon one another, and subjecting them to pressure and heat to form a rigid laminate.

6. The process of claim 5, the polyisocyanate being the reaction product of 2,4-toluene-diisocyanate and 2,3,5-hexane triol.

7. The process of claim 5, the polyisocyanate being triphenyltriisocyanate.

8. A process of making a copper-clad laminate plate for printed electrical circuits, which comprises coating each of a series of separate layers of polyethylene terephthalate fiber with a solution in an organic solvent of a polyisocyanate compound having at least two functional isocyanate groups in its molecule; heating said coated layers at about 80 to 180° C.; then coating each so-treated layer with a thermosetting resin chosen from the group consisting of phenol-formaldehyde resins, glycol-maleic acid condensation products, alkane diol-fumaric acid condensation products and alkane diol-chlorinated phthalic and terephthalic acid condensation products, placing a plurality of the layers upon one another, subjecting them to pressure and heat to form a laminate, and adhering a copper foil to form an outer layer to the surface of said laminate.

References Cited

UNITED STATES PATENTS

| | | | |
|---|---|---|---|
| 2,723,935 | 11/1955 | Rodman | 161—190 |
| 2,849,298 | 8/1958 | Werberig | 161—218 |
| 2,862,281 | 12/1958 | Klausner | 28—75 |
| 2,911,321 | 11/1959 | Hermann et al. | 117—76 |
| 2,929,800 | 3/1960 | Hill et al. | 260—77.5 |
| 2,976,202 | 3/1961 | Salem et al. | 161—227 |
| 2,990,313 | 6/1961 | Knowles et al. | 156—110 |

ROBERT F. BURNETT, Primary Examiner

LINDA M. CARLIN, Assistant Examiner

U.S. Cl. X.R.

117—076; 156—228, 280; 161—92, 93, 190, 192, 231